(12) United States Patent
Yokhin et al.

(10) Patent No.: US 7,481,579 B2
(45) Date of Patent: Jan. 27, 2009

(54) OVERLAY METROLOGY USING X-RAYS

(75) Inventors: Boris Yokhin, Nazareth Illit (IL); Isaac Mazor, Haifa (IL); Sean Jameson, Austin, TX (US); Alex Dikopoltsev, Haifa (IL)

(73) Assignee: Jordan Valley Applied Radiation Ltd., Migdal Ha'emek (IL)

( * ) Notice: Subject to any disclaimer, the term of this patent is extended or adjusted under 35 U.S.C. 154(b) by 340 days.

(21) Appl. No.: 11/389,490

(22) Filed: Mar. 27, 2006

(65) Prior Publication Data

US 2007/0224518 A1 Sep. 27, 2007

(51) Int. Cl.
*G01D 18/00* (2006.01)
(52) U.S. Cl. .................. 378/207; 378/70; 378/205
(58) Field of Classification Search ............ 378/70, 378/71, 76, 79, 81, 82, 86, 207, 205
See application file for complete search history.

(56) References Cited

U.S. PATENT DOCUMENTS

| | | | |
|---|---|---|---|
| 4,446,568 | A | 5/1984 | Williams et al. |
| 4,725,963 | A | 2/1988 | Taylor et al. |
| 4,989,226 | A | 1/1991 | Woodbury et al. |
| 5,151,588 | A | 9/1992 | Kiri et al. |
| 5,481,109 | A | 1/1996 | Nonomiya et al. |
| 5,574,284 | A | 11/1996 | Farr |
| 5,619,548 | A | 4/1997 | Koppel |
| 5,740,226 | A | 4/1998 | Komiya et al. |
| 5,900,645 | A | 5/1999 | Yamada |
| 5,923,720 | A | 7/1999 | Barton et al. |
| 5,949,847 | A | 9/1999 | Terada et al. |
| 5,963,329 | A | 10/1999 | Conrad et al. |
| 6,041,098 | A | 3/2000 | Touryanski et al. |
| 6,118,850 | A | 9/2000 | Mayo et al. |
| 6,192,103 | B1 | 2/2001 | Wormington et al. |
| 6,226,347 | B1 | 5/2001 | Golenhofen |
| 6,226,349 | B1 | 5/2001 | Schuster et al. |
| 6,381,303 | B1 | 4/2002 | Vu et al. |
| 6,389,102 | B2 | 5/2002 | Mazor et al. |
| 6,453,002 | B1 | 9/2002 | Mazor et al. |
| 6,453,006 | B1 | 9/2002 | Koppel et al. |
| 6,507,634 | B1 | 1/2003 | Koppel et al. |

(Continued)

FOREIGN PATENT DOCUMENTS

JP 10 318949 A 12/1998

OTHER PUBLICATIONS

A R Powell, et al., "X-ray diffraction and reflectivity characterization of SiGe superlattice structures", Semicond. Sci. Technol. 7 (1992) 627-631, 1992.

(Continued)

*Primary Examiner*—Allen C. Ho
(74) *Attorney, Agent, or Firm*—Smith, Gambrell & Russell, LLP

(57) ABSTRACT

A method for inspection includes directing a beam of X-rays to impinge upon an area of a sample containing first and second features formed respectively in first and second thin film layers, which are overlaid on a surface of the sample. A pattern of the X-rays diffracted from the first and second features is detected and analyzed in order to assess an alignment of the first and second features.

12 Claims, 4 Drawing Sheets

U.S. PATENT DOCUMENTS

| | | | |
|---|---|---|---|
| 6,512,814 | B2 | 1/2003 | Yokhin et al. |
| 6,556,652 | B1 | 4/2003 | Mazor et al. |
| 6,639,968 | B2 | 10/2003 | Yokhin et al. |
| 6,643,354 | B2 | 11/2003 | Koppel et al. |
| 6,680,996 | B2 | 1/2004 | Yokhin et al. |
| 6,711,232 | B1 | 3/2004 | Janik |
| 6,744,950 | B2 | 6/2004 | Aleksoff |
| 6,750,952 | B2 | 6/2004 | Grodnensky et al. |
| 6,754,305 | B1 * | 6/2004 | Rosencwaig et al. .......... 378/89 |
| 6,756,167 | B2 | 6/2004 | Baluswamy et al. |
| 6,771,735 | B2 | 8/2004 | Janik et al. |
| 6,810,105 | B2 | 10/2004 | Nasser-Ghodsi et al. |
| 7,110,491 | B2 * | 9/2006 | Mazor et al. .................. 378/71 |
| 2001/0028699 | A1 | 10/2001 | Iwasaki |
| 2001/0043668 | A1 | 11/2001 | Hayashi et al. |
| 2002/0097837 | A1 | 7/2002 | Fanton et al. |
| 2002/0110218 | A1 | 8/2002 | Koppel et al. |
| 2003/0002620 | A1 * | 1/2003 | Mazor et al. .................. 378/49 |
| 2003/0157559 | A1 | 8/2003 | Omote et al. |
| 2004/0052330 | A1 | 3/2004 | Koppel et al. |
| 2004/0156474 | A1 | 8/2004 | Yokhin et al. |
| 2004/0218717 | A1 | 11/2004 | Koppel et al. |

OTHER PUBLICATIONS

Hayashi et al., "Refracted X-Rays Propagating Near the Surface under Grazing Incidence Condition", Spectrochimica Acta, Part B 54, 1999, pp. 227-230.

Series 5000 Model XTF5011 X-Ray Tube Information, Oxford Instruments Inc., Scotts Valley, GA, U.S.A., Jun. 1998.

Monolithic Polycapillary Lens Information, X-Ray Optical Systems, Inc., Albany, NY, U.S.A., Dec. 29, 1998. (web site: www.xos.com).

S. Di Fonzo et al., "Non-Destructive Determination of Local Strain with 100-Nanometre Spatial Resolution", Nature, vol. 403, Feb. 10, 2000. (web site: www.nature.com).

F. Neissendorfer, et al., "The energy-dispersive reflectometer/diffractometer at BESSY-I", Meas. Sci. Technol. 10 (1999), 354-361.

Jones, et al., "Small angle x-ray scattering for sub-100 nm pattern characterization", Applied Physics Letters 83:19 (2003), pp. 4059-4061.

V. Rossi, et al., "Energy-dispresive X-ray diffraction on thin films and its application to superconducting samples", J. Appl. Cryst. (2003), 36, 43-47.

T. Saito, et al., "Investigation of new overlay measurement marks for optical lithography", J. Vac. Sci. Technol. B 16(6), Nov.-Dec. 1998.

Wen-Li Wu, et al., "Cross Section and Line Edge Roughness Metrology using Small Angle X-ray Scattering", Metrology Councel AMAG/OMAG, Feb. 16, 2006.

English language Supplemental European Search Report corresponding to EP 00 97 9924, dated Feb. 27, 2008.

* cited by examiner

OVERLAY METROLOGY USING X-RAYS

FIELD OF THE INVENTION

The present invention relates generally to inspection of patterned thin films, and specifically to methods and systems for ascertaining proper alignment of successive layers of patterned thin films that are formed on a substrate.

BACKGROUND OF THE INVENTION

Overlay metrology is commonly used in manufacturing of microelectronic devices in order to verify that features formed by photolithography in successive thin film layers are properly aligned with one another. Overlay metrology systems and techniques that are known in the art measure the difference between the location of a feature in a given layer and its nominal location relative to a fiducial mark in a preceding patterned layer. Typically, the quality of lithographic image alignment is measured by creating special "targets" in each layer, and then determining how well a target on an upper (or overlay) level is centered with respect to a target on a lower level. Overlay metrology system known in the art use optical techniques to measure the distances and spaces between edges or boundaries of the upper and lower targets. Exemplary systems and targets for overlay metrology are described in U.S. Pat. No. 6,756,167, whose disclosure is incorporated herein by reference.

U.S. Pat. No. 6,453,002, whose disclosure is incorporated herein by reference, describes the use of an X-ray microfluorescence analyzer to measure overlay errors between successive layers, such as metallization layers, that are created on a semiconductor wafer in the course of integrated circuit production. A test zone is created on the wafer, in which a pattern made of a metal element in a lower layer is overlaid by a substantially identical pattern made of a different element in an upper layer. When the layers are in proper registration, the pattern in the upper layer substantially shields the element in the lower layer from X-rays and prevents X-ray photons from the first element from reaching X-ray fluorescence detectors. When there is a registration error, however, a portion of the pattern in the lower layer is exposed to X-rays, so that photons from the first element can reach the detectors. A processing unit analyzes the intensity and direction of emission of these X-ray photons in order to determine the degree and direction of misregistration between the upper and lower layers.

U.S. Pat. No. 6,556,652, whose disclosure is incorporated herein by reference, describes X-ray measurement of critical dimensions. According to the method described in this patent, a surface of a substrate is irradiated with a beam of X-rays. A pattern of the X-rays scattered from the surface due to features formed on the surface is then detected and analyzed to measure a dimension of the features in a direction parallel to the surface.

Additional work on X-ray based CD measurements is described by Jones et al., in "Small Angle X-ray Scattering for Sub-100 nm Pattern Characterization," *Applied Physics Letters* 83:19 (2003), pages 4059-4061, which is incorporated herein by reference. The authors use transmission-mode small angle X-ray scattering (SAXS) with a synchrotron X-ray source to characterize a series of polymer photoresist gratings formed on a substrate. The X-ray beam passes through the grating and the substrate, and the SAXS pattern is measured using a two-dimensional CCD detector. The photoresist grating produces a one-dimensional series of diffraction spots in the SAXS pattern on the detector. The SAXS intensity as a function of the scattering vector q is analyzed to determine the grating spacing and sidewall angle.

SUMMARY OF THE INVENTION

As feature dimensions of microelectronic devices become ever smaller, far below optical diffraction limits, it becomes increasingly difficult to measure overlay alignment with sufficient accuracy using optical metrology systems. In response to this difficulty, embodiments of the present invention provide apparatus and methods for overlay metrology using X-ray scattering.

In the embodiments disclosed hereinbelow, features, such as alignment targets, are formed in overlying thin film layers on the surface of a sample. A beam of X-rays is directed to impinge upon the area containing the features, and the resulting X-ray diffraction pattern is detected. Characteristics of the diffraction pattern, such as variations in the amplitudes of the diffraction lobes, may be used to assess the alignment of the features, and hence the alignment of the thin film layers as a whole.

There is therefore provided, in accordance with an embodiment of the present invention, a method for inspection, including:

directing a beam of X-rays to impinge upon an area of a sample containing first and second features formed respectively in first and second thin film layers, which are overlaid on a surface of the sample;

detecting a pattern of the X-rays diffracted from the first and second features; and analyzing the pattern in order to assess an alignment of the first and second features.

In a disclosed embodiment, detecting the pattern of the X-rays includes detecting the diffracted X-rays following transmission of the beam through the sample. Typically, the sample has first and second opposing sides, and directing the beam includes directing the beam to pass through the sample from the first side to the second side, wherein the first and second thin film layers are formed on the second side of the sample.

Additionally or alternatively, directing the beam of X-rays includes collimating and monochromatizing the beam. In some embodiments, detecting the pattern includes using an array of X-ray detectors to detect the diffracted X-rays as a function of angle relative to the beam.

In a disclosed embodiment, the pattern includes diffraction lobes having respective amplitudes, and analyzing the pattern includes determining that the first and second features are misaligned responsively to a variation in the respective amplitudes of the diffraction lobes in the detected pattern. Additionally or alternatively, detecting the pattern includes detecting a two-dimensional diffraction pattern, and analyzing the pattern includes assessing the alignment with respect to two axes.

In one embodiment, the sample includes a semiconductor wafer, and the first and second features include alignment targets formed by a photolithographic process on the surface of the wafer.

There is also provided, in accordance with an embodiment of the present invention, apparatus for inspection, including:

an X-ray source, which is configured to direct a beam of X-rays to impinge upon an area of a sample containing first and second features formed respectively in first and second thin film layers, which are overlaid on a surface of the sample;

a detector, which is arranged to detect a pattern of the X-rays diffracted from the first and second features; and a signal processor, which is coupled to analyze the pattern in order to assess an alignment of the first and second features.

The present invention will be more fully understood from the following detailed description of the embodiments thereof, taken together with the drawings in which:

DETAILED DESCRIPTION OF EMBODIMENTS

Figure 1:
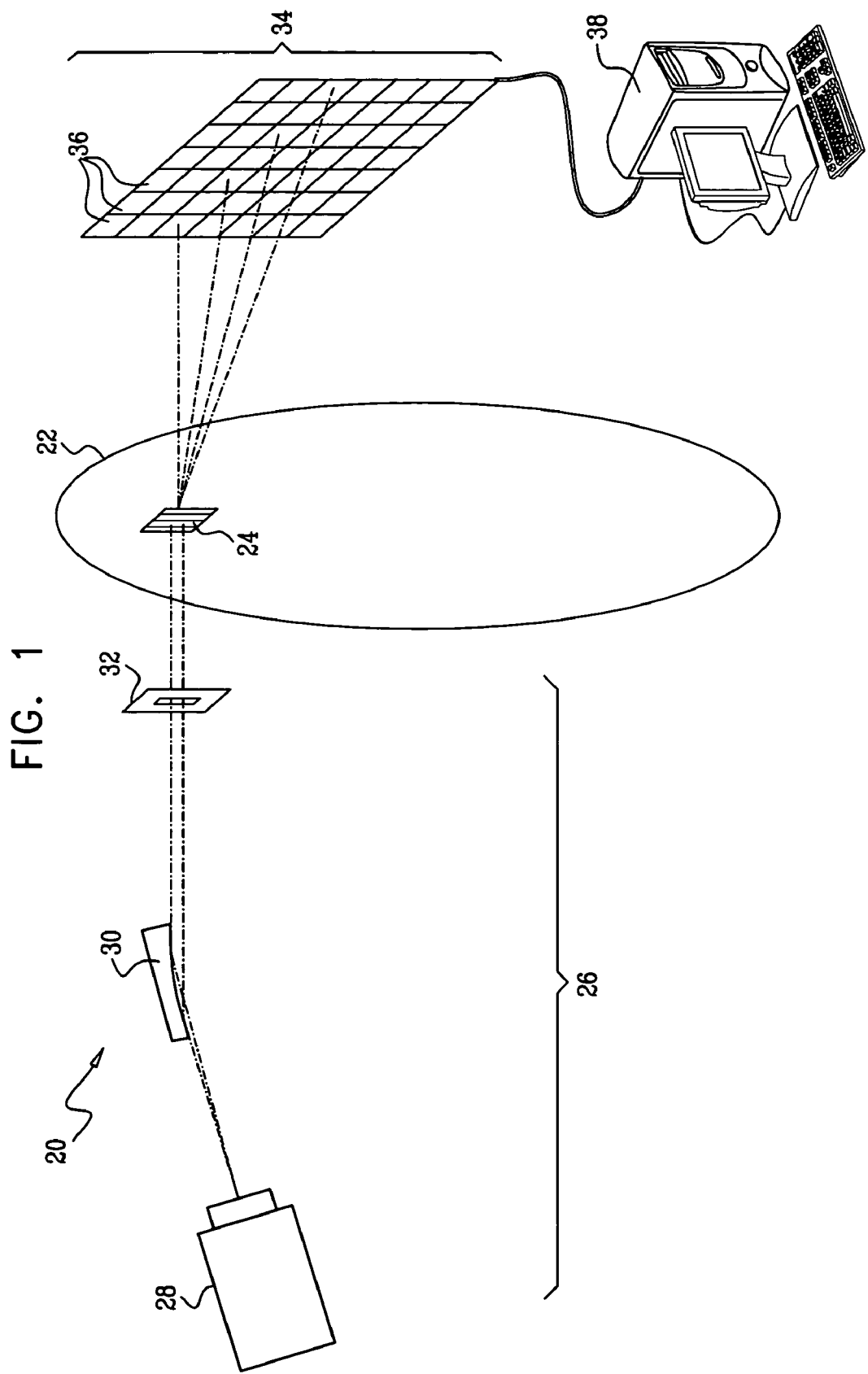
FIG. 1 is a schematic side view of a system for overlay metrology, in accordance with an embodiment of the present invention.

FIG. 1 is a schematic side view of a system 20 for overlay metrology, in accordance with an embodiment of the present invention. The system is used in testing alignment of overlying thin film layers on a sample, such as a semiconductor wafer 22, using an overlay test pattern 24. The test pattern comprises target features formed in the successive thin film layers on wafer 22. The features are chosen so as to give an X-ray diffraction pattern in system 20 that can be analyzed in order to assess the alignment of the features, and hence of the thin film layers. Exemplary targets of this sort are shown in detail in the figures that follow.

An X-ray source 26 irradiates test pattern 24 with a beam of X-rays. (Mounting and motion control components for aligning the X-ray beam with the test pattern are omitted from the figure of the sake of simplicity.) In the embodiment shown in FIG. 1, the X-ray source comprises an X-ray tube 28, typically a microfocus tube, as is known in the art. It is desirable that tube 28 emit high-energy X-rays, typically greater than 13 keV, for high transmittance through wafer 22. The X-ray beam generated by tube 28 is monochromatized and collimated by suitable X-ray optics, such as a multilayer curved mirror 30 and a slit 32. Alternatively, other types of X-ray sources and optics, as are known in the art, may be used to generate the X-ray beam. To optimize diffraction efficiency, it is desirable that the dimensions of test pattern 24 be equal to or slightly larger than the diameter of the collimated X-ray beam that impinges on wafer 22, typically on the order of 100 µm.

In this embodiment, the X-ray beam generated by source 26 impinges on the bottom side of wafer 22 (facing to the left in FIG. 1), whereas the thin film layers, including test pattern 24, are formed on the top side (facing to the right). X-rays passing through the wafer are diffracted by the structure of pattern 24 into multiple diffraction lobes, which are captured by a position-sensitive detector 34. The detector typically comprises an array of detector elements 36, which may be arranged in a two-dimensional matrix, as shown in the figure, or as a linear array. Alternatively, other types of position-sensitive X-ray detectors, as are known in the art, may be used in system 20. Because the scattering efficiency of test pattern 24 may be low, it is desirable that the X-ray source generate a high-intensity beam, and that detector elements 36 have high quantum efficiency, so that the diffraction pattern can be collected over a relatively short integration time.

The output of detector 34 is processed by a signal processor 38, which analyzes the diffraction pattern in order to assess the alignment of the overlying layers in test pattern 24, as described generally hereinbelow. Additionally or alternatively, the signal processor may extract other quality factors from the analysis of the diffraction pattern. Typically, processor 38 comprises a general-purpose computer, with suitable front-end circuits for receiving and processing the signals from detector 34.

Figure 2A:
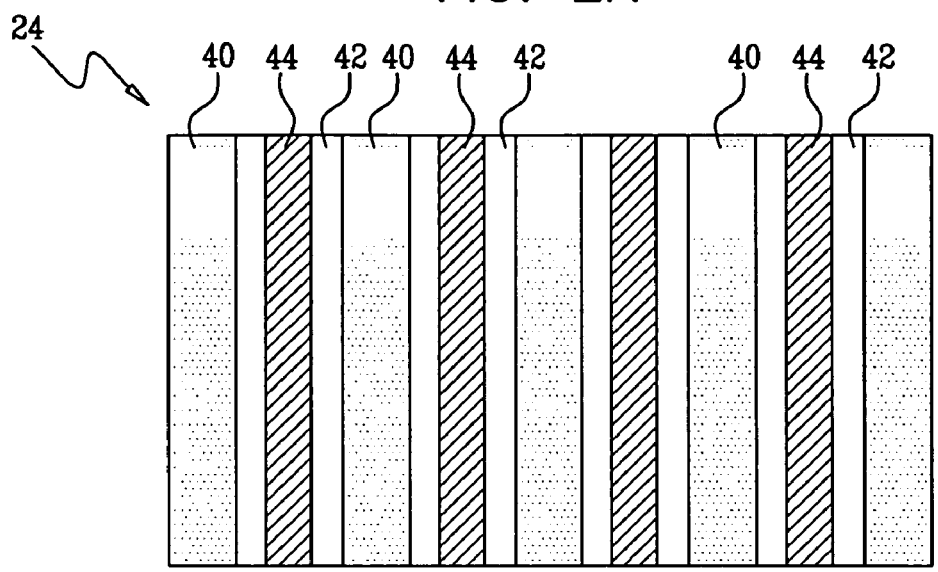
FIG. 2A is a schematic top view of an overlay test pattern formed in successive, patterned thin film layers on a semiconductor wafer, in accordance with an embodiment of the present invention.
Figure 2B:
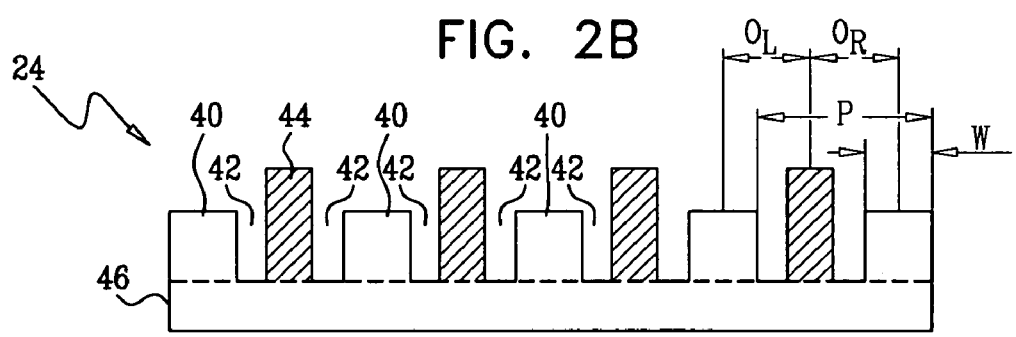
FIG. 2B is a schematic sectional view of the test pattern of FIG. 2A.
Figure 5A:
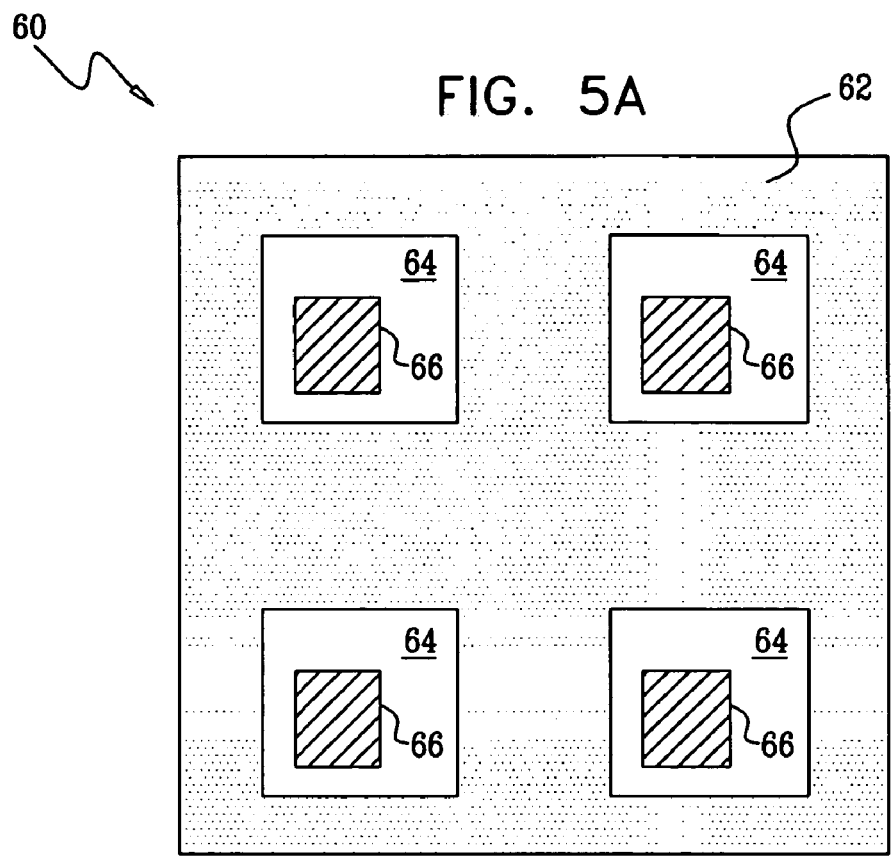
FIGS. 5A and 5B are schematic top views of overlay test patterns, in accordance with alternative embodiments of the present invention.
Figure 5B:
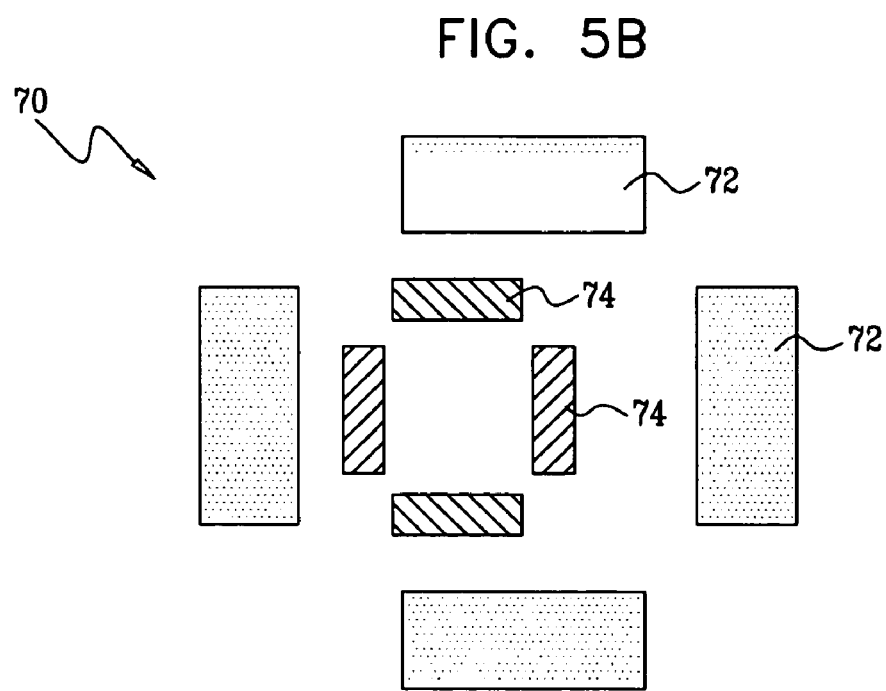

FIGS. 2A and 2B schematically show details of test pattern 24, in accordance with an embodiment of the present invention. FIG. 2A is a top view of the pattern, while FIG. 2B is a sectional view. The pattern comprises target features in the form of interleaved stripes 40 and 44 formed over an underlying layer 46 (which may be the wafer substrate). To create this pattern, a lower thin film layer, such as an interlevel dielectric (ILD) or metal layer, is formed on underlying layer 46 and is then etched to create stripes 40, separated by trenches 42. An upper thin film layer, such as a photoresist layer, is then deposited over the stripes and trenches and is etched to created stripes 44 within trenches 42. This pattern is shown by way of example, and other test patterns that can be used for similar purposes will be apparent to those skilled in the art and are considered to be within the scope of the present invention. Some alternative patterns are shown in FIGS. 5A and 5B.

Test pattern 24 is formed as part of the normal photolithographic process that is used in creating functional features on wafer 22. In other words, the different masks that are used to define the functional features in the successive thin film layers also include stripes 40 and 44. Thus, the alignment and dimensions of the stripes are indicative of the quality of alignment of the different masks, along with other aspects of the quality of the production process. As shown in FIG. 2B, pattern 24 is characterized by a pitch P and width W of the stripes in each layer, as well as right and left offsets $O_R$ and $O_L$ between stripes 40 and stripes 44. Deviations of these characteristic dimensions from their benchmark values may be indicative of deviations in the alignment of the different masks and/or other process deviations. The effect of these deviations may be observed in the diffraction patterns produced in system 20.

Figure 3:
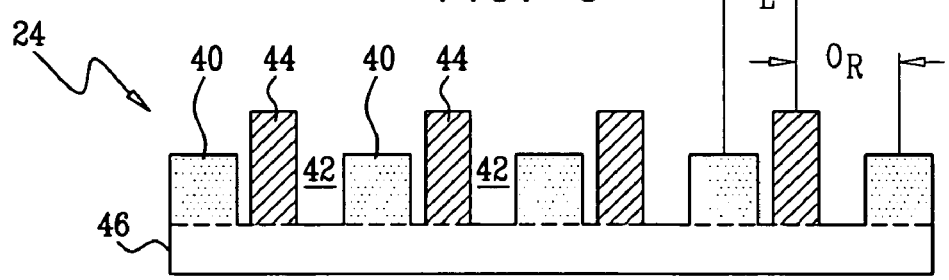
FIG. 3 is a schematic sectional view of the test pattern of FIGS. 2A and 2B under conditions of misalignment of the patterned thin film layers.

FIG. 3, for example, is a schematic, sectional view of test pattern 24 under conditions of mask misalignment. The pitch and width and the stripes in each layer remain the same as in FIG. 2B, but stripes 44 are no longer centered between stripes 40.

Figure 4A:
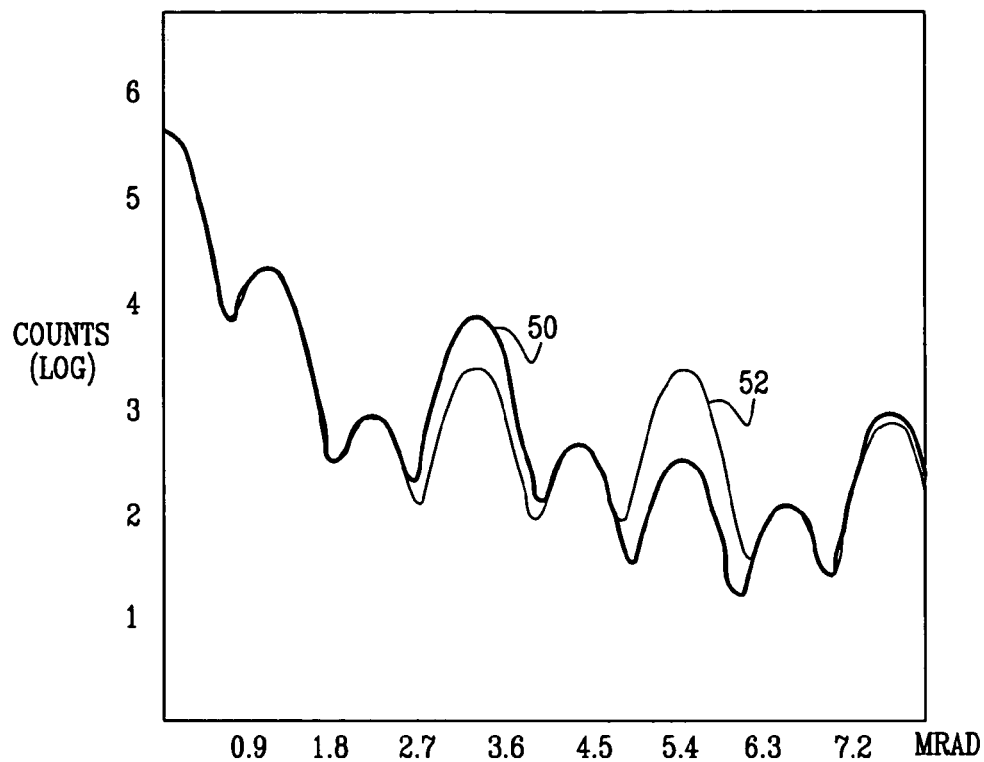
FIGS. 4A and 4B are plots that schematically illustrate X-ray diffraction patterns produced by overlay test patterns under conditions of proper alignment and of misalignment, in accordance with an embodiment of the present invention.

FIG. 4A is a plot that schematically illustrates X-ray diffraction patterns 50 and 52 that may be captured by irradiating test pattern 24 in system 20, in accordance with an embodiment of the present invention. These are simplified, simulated plots, based on a Fraunhoffer diffraction model. For simplicity, stripes 40 are assumed to be square, with W=32.5 nm and P=65 nm. Stripes 44 are assumed to have the same height as stripes 40 and to be 8 nm wide (i.e., test pattern 24 is assumed to have been produced under an 8 nm design rule). The energy of the X-ray beam is taken to be 17.48 keV (MoKα). Pattern 50 corresponds to the properly-aligned configuration shown in FIGS. 2A and 2B, in which stripes 44 are centered between stripes 40, i.e., $O_L = O_R$. Pattern 52 corresponds to the misaligned configuration shown in FIG. 3, in which stripes 44 are shifted by 7.5 nm from the center of trenches 42.

As expected based on the principles of Fraunhoffer diffraction, patterns 50 and 52 comprise a central (zero-order) diffraction lobe at the zero angle, along with multiple higher-order side lobes whose amplitudes generally decrease with increasing angle. Because the period of test pattern 24 does not vary, the periods of diffraction patterns 50 and 52 are likewise identical. The shift of stripes 44 relative to stripes 40, however, causes a variation in the distribution of energy among the side lobes, as can be seen clearly in FIG. 4A. This variation may be quantified in order to measure the relative offset of stripes 40 and 44 in test pattern 24.

Figure 4B:
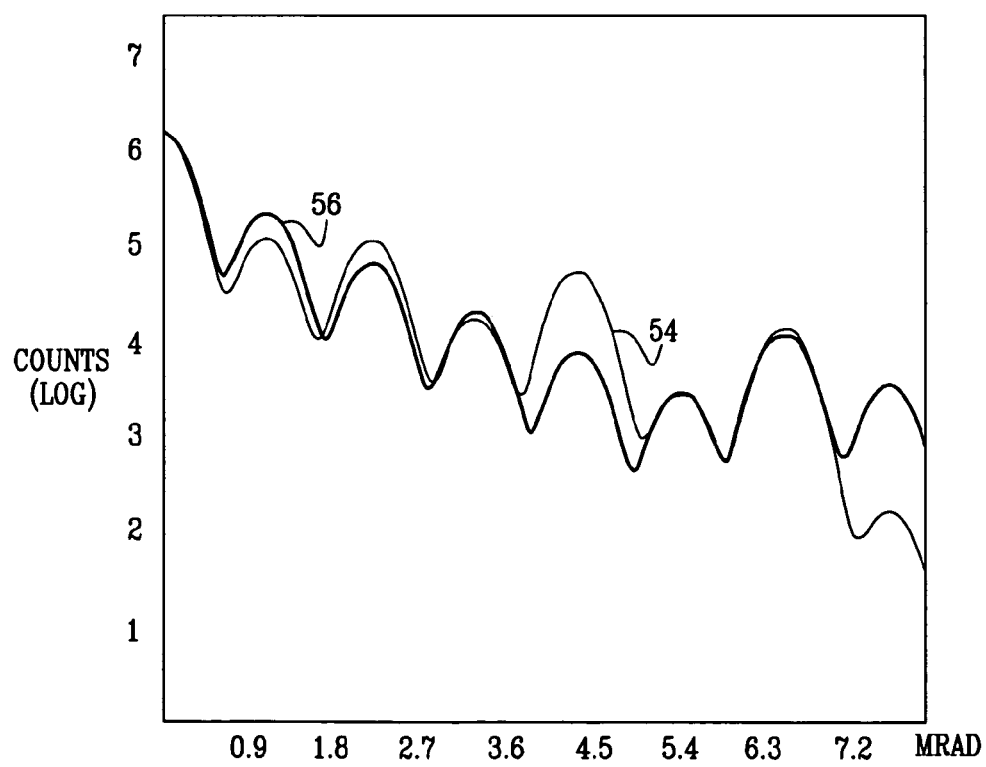

FIG. 4B is a plot that schematically illustrates X-ray diffraction patterns 54 and 56 that may be captured by irradiating test pattern 24 in system 20, in accordance with another embodiment of the present invention. In this case, stripes 40 are assumed to have W=26 nm and P=65 nm. Stripes 44 are 22 nm wide (i.e., test pattern 24 is assumed to have been produced under a 22 nm design rule) and have the same height as stripes 40. As in the preceding example, the energy of the X-ray beam is taken to be 17.48 keV (MoKα). Pattern 54 corresponds to the properly-aligned configuration shown in FIGS. 2A and 2B, while pattern 56 corresponds to the misaligned configuration shown in FIG. 3, in which stripes 44 are again shifted by 7.5 nm from the center of trenches 42. Here, too, the shift in alignment is manifested in a variation in the distribution of energy among the side lobes.

In practice, system 20 may be calibrated using a test wafer in which the dimensions and offsets of the stripes in test pattern 24 are known to be correct (based on scanning electron microscopy, for example). This calibration will give a baseline diffraction pattern, to which the diffraction patterns of production wafers may then be compared. Deviations in the side-lobe amplitudes that are greater than a predefined threshold can then be considered to be indicative of overlay misalignment, as illustrated above in FIGS. 3, 4A and 4B. Additionally or alternatively, other amplitude and frequency variations in the diffraction patterns of production wafers may be indicative of deviations in critical dimensions of features on the wafer. When the diffraction pattern created in system 20 varies significantly from the benchmark, production personnel will typically adjust alignment and/or other process parameters in order to correct the deviations before proceeding with further production.

FIGS. 5A and 5B are schematic top views of test patterns 60 and 70, respectively, which may be used in place of test pattern 24, in accordance with an embodiment of the present invention. Patterns 60 and 70 are two-dimensional patterns, which will give corresponding two-dimensional diffraction patterns. These patterns may be analyzed to determine overlay misalignment along both X- and Y-axes. FIG. 5A shows a "box-in-box" pattern, in which depressions 64 are etched in a first layer 62, and then elevated squares 66 of a subsequent layer are formed within the depressions. In FIG. 5B, bars 74 of the subsequent layer are interspersed with bars 72 of the first layer.

In other embodiments (not shown in the figures), a test pattern is formed without trenches or other depressions. For example, the test pattern may comprise a flat lower layer, made of a material that is transparent to X-rays, which is deposited over a patterned underlying layer. Photoresist may then be deposited over the flat lower layer and etched to form stripes or squares, as shown in the preceding embodiments. Alignment of the patterned photoresist with the patterned underlying layer may then be assessed on the basis of the diffraction pattern as described above.

Although FIG. 1 shows a particular, simplified configuration of a transmission-mode X-ray diffraction system, the principles of the present invention may similarly be applied in other system configurations, including reflection-mode systems (in which the X-ray source and detector are on the same side of the sample under test, rather than opposite sides as in FIG. 1). A reflection-mode X-ray diffraction system that may be used for this purpose is shown, for example, in U.S. patent application Ser. No. 11/018,352, filed Dec. 22, 2004, now U.S. Pat. No. 7,110,491, whose disclosure is incorporated herein by reference. Furthermore, although the embodiments described above use dedicated test patterns for assessing overlay alignment, the principles of the present invention may also be applied in checking relative alignment of overlying functional features in patterned layers on a semiconductor wafer or other sample.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for inspection, comprising:
   directing a beam of X-rays to pass through a sample from a first side to a second, opposing side of the sample via an area of the sample containing first and second features formed respectively in first and second thin film layers, which are overlaid on a surface of the second side of the sample;
   detecting a pattern of the X-rays that have been transmitted through the sample and have been diffracted from the first and second features;
   analyzing the pattern in order to detect a deviation in an alignment of the first and second features; and
   adjusting a process parameter used in producing the features responsively to the deviation.

2. The method according to claim 1, wherein directing the beam of X-rays comprises collimating and monochromatizing the beam.

3. The method according to claim 1, wherein detecting the pattern comprises using an array of X-ray detectors to detect the diffracted X-rays as a function of angle relative to the beam.

4. The method according to claim 1, wherein the pattern comprises diffraction lobes having respective amplitudes, and wherein analyzing the pattern comprises determining that the first and second features are misaligned responsively to a variation in the respective amplitudes of the diffraction lobes in the detected pattern.

5. The method according to claim 1, wherein detecting the pattern comprises detecting a two-dimensional diffraction pattern, and wherein analyzing the pattern comprises assessing the alignment with respect to two axes.

6. The method according to claim 1, wherein the sample comprises a semiconductor wafer, and wherein the first and second features comprise alignment targets formed by a photolithographic process on the surface of the wafer.

7. Apparatus for inspection of a sample having first and second opposing sides and containing first and second features formed respectively in first and second thin film layers, which are overlaid on a surface of the second side of the sample, the apparatus comprising:

an X-ray source, which is configured to direct a beam of X-rays to pass through a sample from the first side to the second side of the sample via an area of the sample containing the first and second features;

a detector, which is arranged to detect a pattern of the X-rays that have been transmitted through the sample and have been diffracted from the first and second features; and a signal processor, which is coupled to the detector so as to receive and analyze the pattern in order to assess an alignment of the first and second features.

8. The apparatus according to claim 7, wherein the X-ray source comprises an X-ray tube and X-ray optics for collimating and monochromatizing the beam.

9. The apparatus according to claim 7, wherein the detector comprises an array of X-ray detectors, which are arranged so as to detect the diffracted X-rays as a function of angle relative to the beam.

10. The apparatus according to claim 7, wherein the pattern comprises diffraction lobes having respective amplitudes, and wherein the signal processor is adapted to determine that the first and second features are misaligned responsively to a variation in the respective amplitudes of the diffraction lobes in the detected pattern.

11. The apparatus according to claim 7, wherein the pattern comprises a two-dimensional diffraction pattern, and wherein the signal processor is adapted to analyze the pattern so as to assess the alignment with respect to two axes.

12. The apparatus according to claim 7, wherein the sample comprises a semiconductor wafer, and wherein the first and second features comprise alignment targets formed by a photolithographic process on the surface of the wafer.

* * * * *